United States Patent
Salling et al.

(10) Patent No.: US 6,767,810 B2
(45) Date of Patent: Jul. 27, 2004

(54) METHOD TO INCREASE SUBSTRATE POTENTIAL IN MOS TRANSISTORS USED IN ESD PROTECTION CIRCUITS

(75) Inventors: Craig T. Salling, Plano, TX (US); Amitava Chatterjee, Plano, TX (US); Youngmin Kim, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/629,514

(22) Filed: Jul. 29, 2003

(65) Prior Publication Data

US 2004/0021180 A1 Feb. 5, 2004

Related U.S. Application Data

(62) Division of application No. 09/975,107, filed on Oct. 11, 2001, now abandoned.

(51) Int. Cl.[7] .................. H01L 21/8249; H01L 21/336; H01L 21/425

(52) U.S. Cl. ....................... 438/527; 438/234; 438/236; 438/294; 438/335; 438/514; 438/519; 438/526

(58) Field of Search ................................. 438/234, 236, 438/294, 335, 514, 519, 526, 527

(56) References Cited

U.S. PATENT DOCUMENTS 6,399,990 B1 * 6/2002 Brennan et al. ............ 257/355

* cited by examiner

Primary Examiner—Tuan H. Nguyen
Assistant Examiner—David L. Hogans
(74) Attorney, Agent, or Firm—W. James Brady, III; Frederick J. Telecky, Jr.

(57) ABSTRACT

An integrated circuit located between isolation trenches at the surface of a semiconductor chip comprising a first well of a first conductivity type having a first resistivity. This first well has a shallow buried region of higher resistivity than the first resistivity, extending between the isolation trenches and created by a compensating doping process. The circuit further comprises a second well of the opposite conductivity type extending to the surface between the isolation trenches, having a contact region and forming a junction with the shallow buried region of the first well, substantially parallel to the surface. Finally, the circuit has a MOS transistor located in the second well, spaced from the contact region, and having source, gate and drain regions at the surface. This space is predetermined to create a small voltage drop in I/O transistors for conditioning signals and power to a pad, or large voltage drops in ESD circuits for protecting the active circuitry connected to a pad. In the first embodiment, the space includes a dummy gate; in the second embodiment, an isolation region; in the third embodiment, the space a protected, stable surface.

10 Claims, 7 Drawing Sheets

METHOD TO INCREASE SUBSTRATE POTENTIAL IN MOS TRANSISTORS USED IN ESD PROTECTION CIRCUITS

This is a divisional of Application Ser. No. 09/975,107, filed Oct. 11, 2001, now abandoned.

FIELD OF THE INVENTION

The present invention is related in general to the field of electronic systems and semiconductor devices, and more specifically to structure and fabrication methods of MOS transistors, which have an increased substrate potential for improved ESD protection.

DESCRIPTION OF THE RELATED ART

Integrated circuits (ICs) may be severely damaged by electrostatic discharge (ESD) events. A major source of ESD exposure to ICs is from the charged human body ("Human Body Model", HBM); the discharge of the human body generates peak currents of several amperes to the IC for about 100 ns. A second source of ESD is from metallic objects ("machine model", MM); it can generate transients with significantly higher rise times than the HBM ESD source. A third source is described by the "charged device model" (CDM), in which the IC itself becomes charged and discharges to ground in the opposite direction than the HBM and MM ESD sources. More detail on ESD phenomena and approaches for protection in ICs can be found in A. Amerasekera and C. Duvvury, "ESD in Silicon Integrated Circuits" (John Wiley & Sons LTD. London 1995), and C. Duvvury, "ESD: Design for IC Chip Quality and Reliability" (Int. Symp. Quality in El. Designs, 2000, pp. 251–259; references of recent literature).

ESD phenomena in ICs are growing in importance as the demand for higher operating speed, smaller operating voltages, higher packing density and reduced cost drives a reduction of all device dimensions. This generally implies thinner dielectric layers, higher doping levels with more abrupt doping transitions, and higher electric fields—all factors that contribute to an increased sensitivity to damaging ESD events.

The most common protection schemes used in metal-oxide-semiconductor (MOS) ICs rely on the parasitic bipolar transistor associated with an nMOS device whose drain is connected to the pin to be protected and whose source is tied to ground. The protection level or failure threshold can be set by varying the nMOS device width from the drain to the source under the gate oxide of the nMOS device. Under stress conditions, the dominant current conduction path between the protected pin and ground involves the parasitic bipolar transistor of that nMOS device. This parasitic bipolar transistor operates in the snapback region under pin positive with respect to ground stress events.

The dominant failure mechanism, found in the nMOS protection device operating as a parasitic bipolar transistor in snapback conditions, is the onset of second breakdown. Second breakdown is a phenomenon that induces thermal runaway in the device wherever the reduction of the impact ionization current is offset by the thermal generation of carriers. Second breakdown is initiated in a device under stress as a result of self-heating. The peak NMOS device temperature, at which second breakdown is initiated, is known to increase with the stress current level.

Many circuits have been proposed and implemented for protecting ICs from ESD. One method that is used to improve ESD protection for ICs is biasing the substrate of ESD protection circuits on an IC. Such substrate biasing can be effective at improving the response of a multi-finger MOS transistor that is used to conduct an ESD discharge to ground. However, substrate biasing can cause the threshold voltages for devices to change from their nominal values, which may affect device operation. In addition, substrate biasing under steady-state conditions causes heat generation and increases power losses.

Solutions offered in known technology require additional IC elements, silicon real estate, and/or process steps (especially photomask alignment steps). Their fabrication is, therefore, expensive. Examples of device structures and methods are described in U.S. Pat. No. 5,539,233, issued Jul. 23, 1996 (Amerasekera et al., "Controlled Low Collector Breakdown Voltage Vertical Transistor for ESD Protection Circuits"); U.S. Pat. No. 5,793,083, issued Aug. 11, 1998 (Amerasekera et al., "Method for Designing Shallow Junction, Salicided NMOS Transistors with Decreased Electrostatic Discharge Sensitivity"); U.S. Pat. No. 5,940,258, issued Aug. 17, 1999 (Duvvury, "Semiconductor ESD Protection Circuit"); U.S. Pat. No. 6,137,144, issued Sep. 24, 2000, and U.S. Pat. No. 6,143,594, issued Nov. 7, 2000 (Tsao et al, "On-Chip ESD Protection in Dual Voltage CMOS); and U.S. patent application Ser. No. 09/456,036, filed Dec. 3, 1999 (Amerasekera et al., "Electrostatic Discharge Device and Method").

With the continued scaling in deep submicron technologies, it is important to search for ways to increase the strength of bipolar turn-on of nMOS transistors used in ESD protection circuits based on snap-back characteristics. In addition, the challenge of cost reduction implies a drive for minimizing the number of process steps, especially a minimum number of photomask steps, and the application of standardized process conditions wherever possible. These constraints should be kept in mind when additional process steps or new process conditions are proposed to improve ESD insensitivity without sacrificing any desirable device characteristics. An urgent need has, therefore, arisen for a coherent, low-cost method of enhancing ESD insensitivity without the need for additional, real-estate consuming protection devices. The device structure should further provide excellent electrical performance, mechanical stability and high reliability. The fabrication method should be simple, yet flexible enough for different semiconductor product families and a wide spectrum of design and process variations. Preferably, these innovations should be accomplished without extending production cycle time, and using the installed equipment, so that no investment in new manufacturing machines is needed.

SUMMARY OF THE INVENTION

The present invention describes an integrated circuit located between isolation trenches at the surface of a semiconductor chip comprising a first well of a first conductivity type having a first resistivity. This first well has a shallow buried region of higher resistivity than the first resistivity; the region extends between the isolation trenches. The circuit further comprises a second well of the opposite conductivity type extending to the surface between the isolation trenches, having a contact region and forming a junction with the shallow buried region of the first well, substantially parallel to the surface. Finally, the circuit has a MOS transistor located in the second well, spaced from the contact region, and having source, gate and drain regions at the surface. This space is predetermined to create a small voltage drop in I/O transistors for conditioning signals and power to a pad, or large voltage drops in ESD circuits for protecting the active circuitry connected to a pad. The space may have a linear or meandering outline.

In the first embodiment of the invention, the space between the contact and the source includes a dummy gate. In the second embodiment, the space includes an isolation region. In the third embodiment, the space includes a protected, stable surface. In all embodiments, the region of higher resistivity may have a resistivity about an order of magnitude higher than the first resistivity, and this higher resistivity is brought about by a compensating doping process according to the invention.

The dummy gate structures of the first embodiment are formed concurrently with the MOS gate structures. Consequently, the distribution of the subsequently implanted ions is modulated so that the junction between the second well and the region of higher resistivity of the first well has variable distance to the chip surface in accordance with the configuration of the transistor gate and dummy gate structures.

The isolation region in the space between contact and source of the second embodiment is formed before second-well ion implant. Consequently, the second well has to be created by ions implanted with higher energy than in the first embodiment and the junction between the second well and the region of higher resistivity of the first well has a greater distance from the surface. This distance, however, is variable in accordance with the configuration of the transistor gate and the isolation region.

In the third embodiment, the distance of the junction to the surface varies in accordance with the transistor gate structure.

It is a technical advantage of the present invention that the electrical substrate resistance, and the equivalent voltage drop, generated by the distance discussed above can be designed for several applications:

A small substrate resistance operates in an I/O transistor to condition signals and power to a pad so that the substrate current noise is blocked to get to the rest of the circuit, or that sensitive, non-I/O circuits are shielded from substrate current noise.

A large substrate resistance, and thus large voltage drop, operates in an ESD circuit to protect the active circuitry connected to a pad.

The circuit of the present invention is electrically connected so that the source is connected to Vss (ground) potential; the drain to pad potential; the contact region to Vss (ground) potential; and the first well to Vdd potential. The operation of the MOS transistor is such that the voltage drop is caused by the part of the drain avalanche current flowing through the second well to the contact region through the resistance of the second well. When that resistance is small, the voltage drop conditions signal and power to the pad. When that resistance is large, the voltage drop de-biases the junction between the second well and the low-doped portion of the first well. As a consequence, the lateral transistor formed by drain, second well, and contact is turned on and the ESD protection of the pad is greatly enhanced.

In one embodiment of the invention, the first conductivity type is n-type and the MOS transistor is an nMOS transistor. The present invention is equally applicable to pMOS transistors; the conductivity types of the semiconductor and the ion implant types are simply reversed.

It is another technical advantage of the present invention that the same photomask and alignment step can be used for several fabrication process steps, thus reducing fabrication cost. Specifically, the ion implantation steps for creating the iso-p-well, the drain extension, and the transistor Vt adjustment are consecutively performed through the same photoresist window.

Another technical advantage of the present invention is the flexibility in creating the different substrate resistances discussed above. Instead of employing the second well of opposite conductivity type, a separate well of the first conductivity type can be used.

The technical advances represented by the invention, as well as the aspects thereof, will become apparent from the following description of the preferred embodiments of the invention, when considered in conjunction with the accompanying drawings and the novel features set forth in the appended claims.

BRIEF DESCRIPTION OF THE DRAWINGS

FIGS. 3A and 3B represent schematic cross sections of a lateral MOS transistor according to the first embodiment of the invention, including a dummy gate as a spacing tool. In FIG. 3A, this dummy gate is designed to operate in an ESD protection circuit; in FIG. 3B, this dummy gate is designed to operate in an I/O transistor for conditioning signals and power to a pad.

FIGS. 4A and 4B represent schematic cross sections of a lateral MOS transistor according to the second embodiment of the invention, including an isolation region as a spacing tool. In FIG. 4A, this isolation region is designed to operate in an ESD protection circuit; in FIG. 4B, this dummy gate is designed to operate in an I/O transistor for conditioning signals and power to a pad.

FIG. 6B is a simplified cross section along line B–B' of the structure in FIG. 6A. FIG. 6B further shows a photomask window used for several ion implant steps, illustrating the low cost aspect of the present invention.

FIGS. 8 to 13 are schematic and simplified cross sections of an MOS transistor illustrating individual process steps in the fabrication flow according to the invention.

DETAILED DESCRIPTION OF THE PREFERRED EMBODIMENTS

The present invention is related to U.S. patent application Ser. No. 60/263,619, filed on Jan. 23, 2001 (Salling et al., "Structure and Method of MOS Transistor having Increased Substrate Resistance").

Figure 1A:
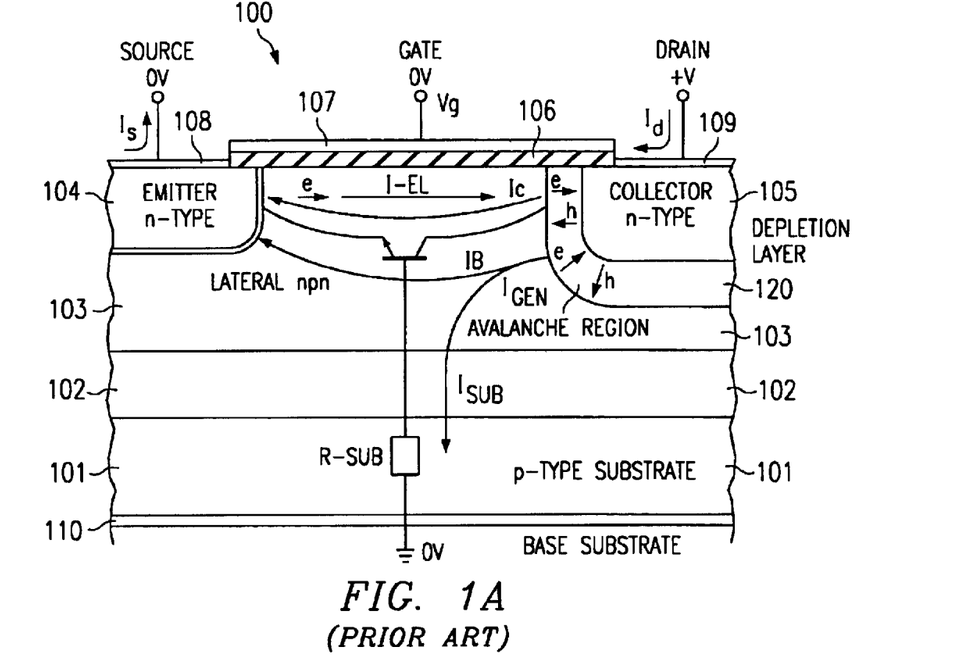
FIG. 1A is a simplified and schematic cross section through a lateral MOS transistor, illustrating the current flow at an electrostatic discharge event, with the ground contact of the substrate current Isub at the back of the device.

The impact of the present invention can be most easily appreciated by highlighting the shortcomings of the known technology. The schematic cross section of FIG. 1A illustrates a commonly used integrated circuit (IC) component 100 in an ESD protection circuit, namely an nMOS transistor which operates in the mode of a lateral bipolar npn transistor during an ESD event and provides a low impedance current path to ground. The IC is formed in a semiconductor of a "first conductivity" type; in the example of FIG. 1A, this "first conductivity" is p-type, the MOS transistor is an nMOS transistor, and the lateral bipolar transistor is an npn transistor. In present manufacturing, the first conductivity type semiconductor is created by the net doping due to a "substrate" and a "well".

As defined herein, the term "substrate" refers to the starting semiconductor wafer. In present manufacturing, the substrate typically has p-type doping. For clarity, this case is also selected as the basis for the following discussions. It should be stressed, however, that the invention and all description also cover the case where the substrate has n-type doping. In FIG. 1A, the substrate is designated 101. Frequently, but not necessarily, an epitaxial layer 102 of the same conductivity type as the substrate has been deposited over the substrate 101; in this case the term "substrate" refers to epitaxial layer 102 plus starting semiconductor 101. For the conductivity example selected for FIG. 1A, a p-well 103 has been formed by localized acceptor ion implantation and annealing. An n-plus source region 104 (the emitter of the bipolar transistor) and drain region 105 (the collector of the bipolar transistor) were formed by shallow ion implants of donors. The surface between the emitter 104 and the collector 105 is covered by gate oxide layer 106. Layers 107, 108, 109, and 110 provide metallic contacts to the gate, emitter, collector and the wafer backside, respectively.

FIG. 1A further shows that emitter 108, gate 107 and wafer backside 110 are electrically connected to ground potential (0 V). A positive voltage spike at the collector, as caused by an ESD event, applies a reverse bias to the collector/base junction; the base is the substrate 101 (in some devices, epitaxial layer 102 plus the substrate 101); the depletion layer of the space charge region is designated 120. When the electric field in the depletion region 120 exceeds the breakdown field, avalanching occurs and forms electron/hole pairs. Electrons flow into the collector, and holes flow into the p-type base.

This hole current I-sub flows from the collector junction through the substrate to the backside contact 110, causing a voltage drop across the resistors R-pwell and R-sub, which positive (forward) biases the emitter/base junction. This emitter forward bias is proportional to the effective "substrate resistance" equal to the sum of the resistance components in the current path, which are schematically shown as R-pwell and R-sub in FIG. 1A. Those of the electrons injected from the emitter into the base which reach the collector depletion layer will participate in the avalanche mechanism.

Figures 1B, 2:
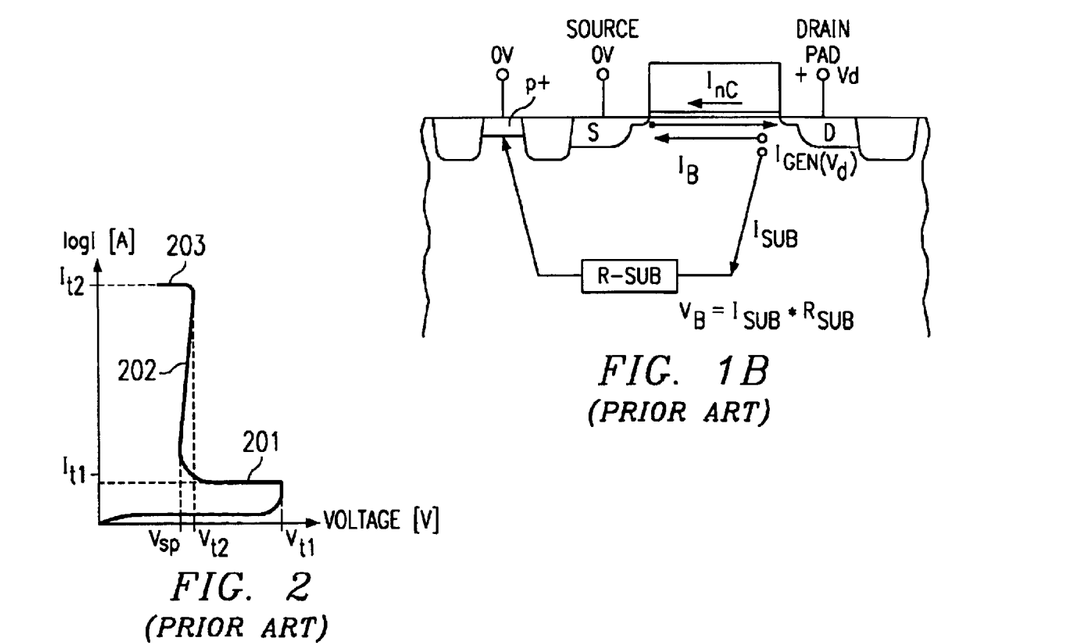
FIG. 1B is a still more simplified cross section through a MOS transistor analogous to FIG. 1A yet with the ground contact of the substrate current Isub located at the surface.
FIG. 2 is a schematic plot of drain (collector) current, on a logarithmic scale, as a function a drain voltage, on a linear scale, illustrating the onset of the second breakdown phenomenon.

In the schematic cross section of FIG. 1B, the same layout and electrical scenario as in FIG. 1A is depicted with the exception that the ground contact for the substrate current Isub is located at the surface instead of at the backside of the device. This arrangement of FIG. 1B is frequently used in circuit designs.

The electron concentration will be multiplied in accordance with the electric field dependent avalanche multiplication factor. The resulting reduction of the device impedance is reflected in a "snap back" 201 in the current-voltage characteristic, which corresponds to a "turn on" of the bipolar transistor. FIG. 2 plots the collector (or drain) current I (on a logarithmic scale) as a function of drain voltage V (on a linear scale). As illustrated in FIG. 2, this snap-back 201 occurs at the collector/drain voltage Vt1 with an associated collector/drain current It1. The field dependence of the avalanche multiplication factor is responsible for establishing a new stable current/voltage equilibrium 202. At high electron injection levels, base conductivity modulation also contributes towards making the device impedance positive again. It should be mentioned that the lateral npn transistor also protects against negative ESD pulses. The collector 105 (in FIG. 1A) now acts as emitter and diverts the ESD current to the backside substrate contact 110 and to the now reverse biased emitter 104, which now acts as collector.

The current carrying capability of the device is limited by thermal effects in the avalanching collector depletion layer. A number of effects (such as the increase of intrinsic carrier concentration, a reduced carrier mobility, a decrease in thermal conductivity, and a lowering of the potential barrier for tunnel currents) contribute to the onset of the second (thermal) breakdown (203 in FIG. 2). The second breakdown trigger current It2 is very sensitive to the device design, especially the doping profiles. Second breakdown results in junction melting and in an irreversible increase in leakage currents. It must, therefore, be avoided for normal device operation.

It is important for the present invention to conclude from FIGS. 1A and 1B and the above discussion of FIG. 2 that increasing the resistors R-pwell and/or R-sub will lead to an earlier turn-on of the emitter and to a reduction of the current contribution of the avalanche mechanism. This is reflected in an increase of the second breakdown threshold current It2. As was pointed out in the above-referenced publication by K. Bock et al., the p-well resistance R-pwell, and thus It2, can be modified by the p-well doping. However, known technology recommended only a lower substrate (or epitaxial) doping or a lower implant dose as methods to increase the p-well resistance.

The structure and design of the MOS transistor having the predetermined value of the substrate resistance, and thus voltage drop, is discussed in FIGS. 3 to 7 for several embodiments of the present invention. Furthermore, applications of the invention to ESD circuits as well as generalized I/O transistors are indicated. The flexible and economical method for fabricating the embodiments according to the invention is described in FIGS. 8 to 13. While the examples depicted embody the experimental conditions for an nMOS transistor, analogous considerations hold for the conditions of a pMOS transistor.

Figure 3A:
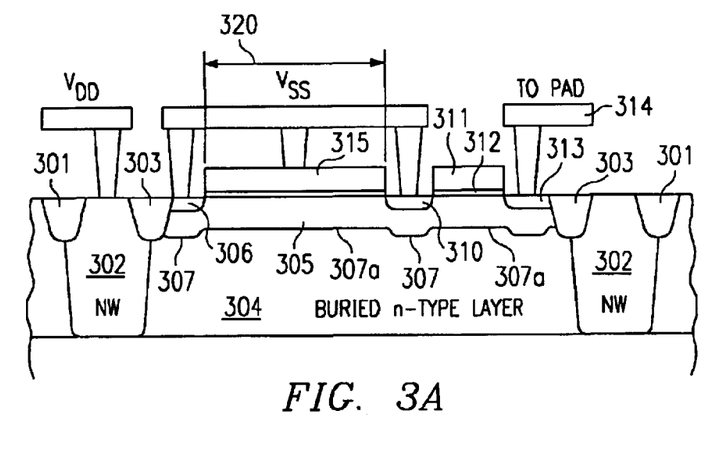

The schematic cross section of FIG. 3A (and analogous FIG. 3B) depicts a portion of a semiconductor chip surface with isolation trenches 301 defining the region for a first well 302 of a first conductivity type. In FIG. 3A, the first conductivity type is selected to be n-type, so well 302 is an n-well. N-well 302 is fabricated by implanting ions of a first conductivity type into the semiconductor surface through a photoresist window between the isolation regions 301. The ions have high energy and high dose and create a resistivity for the first well 302 referred to as "first resistivity".

Nested inside isolation trenches 301 is another set of isolation trenches 303. A second photoresist layer is now deposited and a window opened in this layer between isolation trenches 303. Through this new window, ions of the opposite conductivity type are implanted at high energy and low dose so that they partially compensate for the doping of the well 302 in the region between trenches 303. By this "counter-doping", a region 304 of lower doping concentration (still of the first conductivity type) is created, which is embedded within well 302, yet may have the same penetration depth. For the conductivity type selected in FIG. 3A, region 304 is sometimes referred to as "buried n-type layer". Region 304 has a resistivity higher than the resistivity of the first well 302 (but still the same conductivity type).

In the surface-near region, between trenches 303 and extending to the surface, is a second well 305, of the opposite conductivity type (p-type in FIG. 3A; "isolated p-well"). This second well has a contact 306 (p+ in FIG. 3A) and forms a junction 307 with the buried layer of the first conductivity type (n-type in FIG. 3A). Junction 307 is substantially parallel to the surface, but the distance of junction 307 to the surface varies in accordance with the configuration of transistor gate and dummy gate structures, or isolations. As can be seen in FIG. 3A, the junction 307a does not penetrate as deep under the transistor gate and dummy gate structures—a consequence of the fabrication method by ion implantation discussed below. Under electrical operating conditions, well 305 represents a resistance for a current flowing from the MOS transistor to well contact 306; this resistance is called "substrate resistance" Rsub in the nomenclature of FIG. 1B.

A MOS transistor is located in well 305, having source 310, gate 311 and gate isolation 312, and drain 313 at the surface. It is essential for the present invention that this MOS transistor is spaced from well contact 306. The space may be linear as in FIG. 3A (320) and FIG. 3B (321), or it may be configured meandering or in any other suitable outline. The space is predetermined to create, under electrical operating conditions, a voltage drop along Rsub for the current Isub (see FIG. 1B) from the MOS transistor to well contact 306.

Figure 3B:
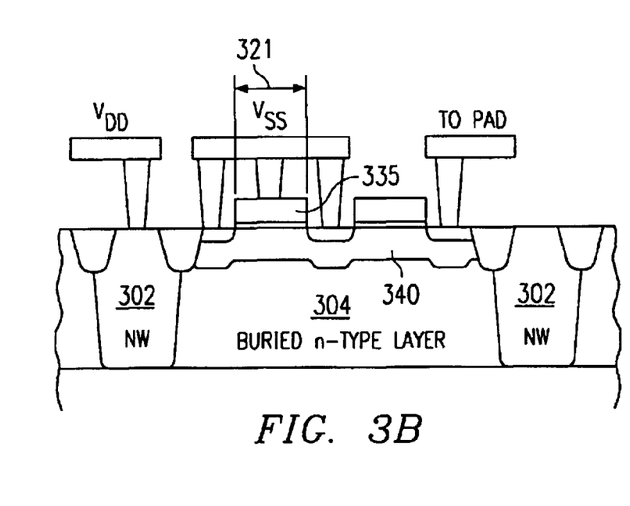

The magnitude of the predetermined voltage drop depends on the application the integrated circuit depicted in FIGS. 3A and 3B. The voltage drop is intended to be large in ESD circuits for protecting the active circuitry connected to pad 314, which is connected to drain 313. Consequently, the distance 320 in FIG. 3A is large in order to create a large resistance Rsub. The voltage drop is intended to be small in electrically isolated I/O transistors for conditioning signals or power to a pad. Consequently, the distance 321 in FIG. 3B is small in order to create a small resistance Rsub. As a general structure, an electrically isolated I/O transistor is distinguished because its substrate noise is blocked from getting to the rest of the circuit. It also can be applied to sensitive, non-I/O circuits in order to shield them from substrate noise current.

In the first embodiment of this invention, the space between the well contact 306 and the transistor source 310 includes a dummy gate. In FIG. 3A, the space 320 includes the dummy gate 315 (connected to Vss/ground potential), which actually determines the dimension of space 315. This space falls into the "large" category described above, since it is intended for an ESD circuit. In FIG. 3B, the space 321 includes dummy gate 335, which again determines the dimension of space 321. This space falls into the "small" category described above, since it is intended for an electrically isolated I/O transistor. Accordingly, the second well 340, which determines Rsub, is shorter; in the other aspects, the circuit in FIG. 3B is analogous to the circuit in FIG. 3A.

Figure 4A:
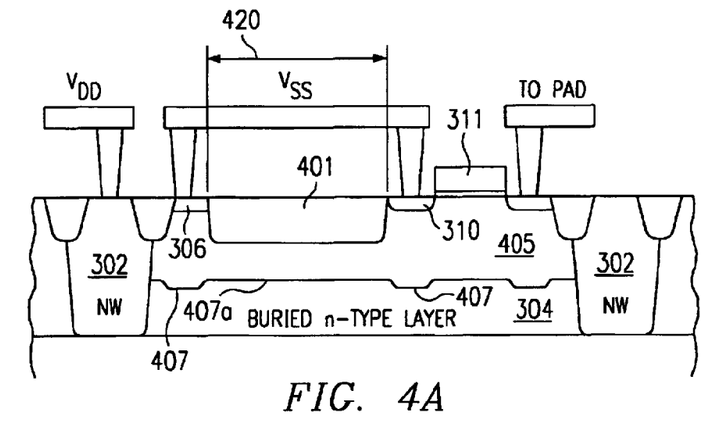
Figure 4B:
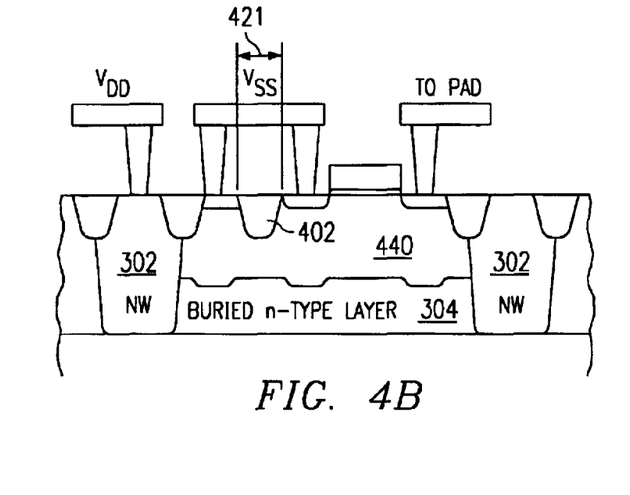

In the second embodiment of this invention, the space between the well contact 306 and the transistor source 310 includes an isolation region. In FIG. 4A, this isolation region, designated 401, determines the dimension of space 420. In FIG. 4B, the isolation region, designated 402, determines the dimension of space 421. Space 420 falls into the "large" category, since it is intended for an ESD circuit. Space 421 falls into the "small" category, since it is intended for an electrically isolated I/O transistor.

As can be seen in FIGS. 4A and 4B, the second wells 405 and 440 of the opposite conductivity (p-type; "isolated p-well") have to be ion implanted considerably deeper (farther away from the surface) due to the depth of the isolation regions 401 and 402. Junction 407 is substantially parallel to the surface, but the distance of junction 407 to the surface varies in accordance with the configuration of transistor gate 311 and isolation structure 401, designated by 407 and 407a in FIG. 4A.

Alternatively, the space between the well contact and the transistor source may include just a protected surface (without dummy gate or isolation region). It may be linear, meandering or have any other suitable outline.

The electrical connection of the circuits in FIGS. 3A, 3B, 4A, and 4B are analogous as follows:

Transistor source 310 is connected to Vss (ground);
Transistor drain 313 is connected to pad potential;
Well contact 306 is connected to Vss (ground);
Well 302 is connected to Vdd;
The MOS transistor is operated such that a voltage drop is caused by the part of the drain avalanche current flowing to contact 306 through resistance Rsub of second well 305/340/405/440,
whereby, when Rsub is small, the voltage drop conditions signal and power to the pad (314);
whereby, when Rsub is large, the voltage drop de-biases the junction between second well and the low-doped portion 304 of the first well 302, turning-on the lateral transistor formed by drain 313, second well 305, and contact 306, and enhancing the ESD protection of said pad.

The schematic FIGS. 5A, 5B, 6A and 6B describe embodiments of the invention for device cases, where design constraints do not provide enough space for the buried n-layer and the isolated p-well to create enough voltage drop. For these situations, the solution disclosed in the FIGS. utilizes an additional discrete n-well, which offers enough additional electrical resistance for Isub when it is electrically connected to the isolated p-well.

Figure 5A:
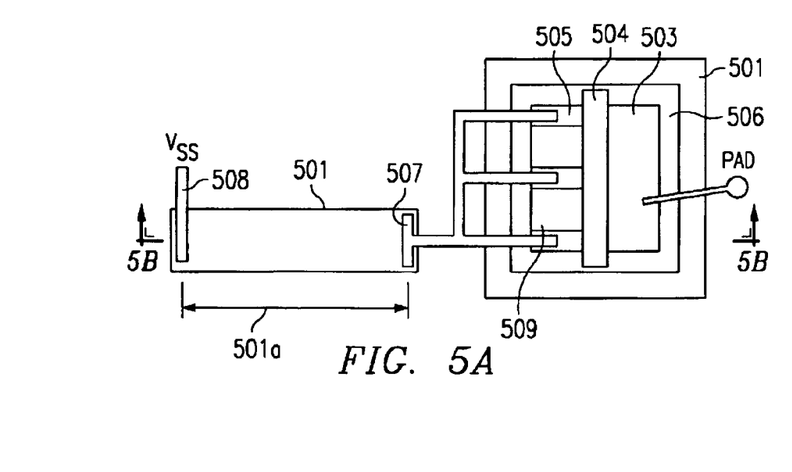
FIG. 5A is a simplified top view of an embodiment of the invention, in which a separate well of the first conductivity type generates the desired substrate resistance.
Figure 5B:
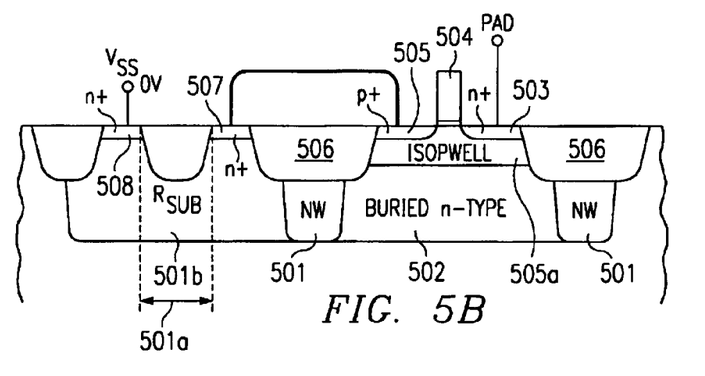
FIG. 5B is a simplified cross section along line A–A' of the structure in FIG. 5A.
Figure 6A:
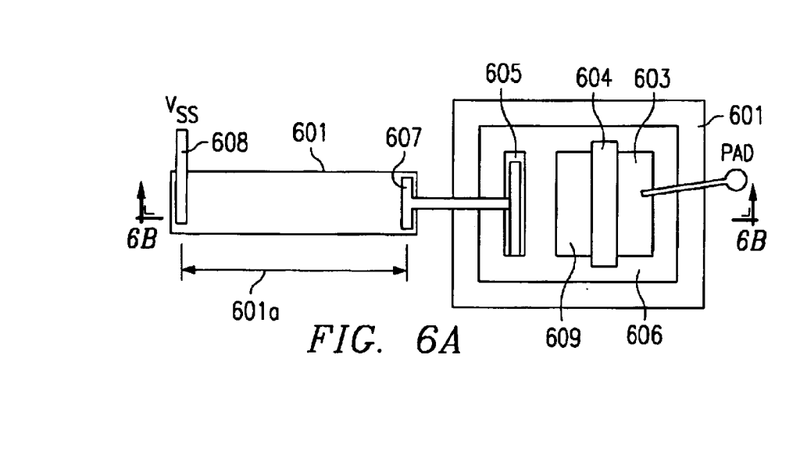
FIG. 6A is a simplified top view of another embodiment of the invention, in which a separate well of the first conductivity type generates the desired substrate resistance.
Figure 6B:
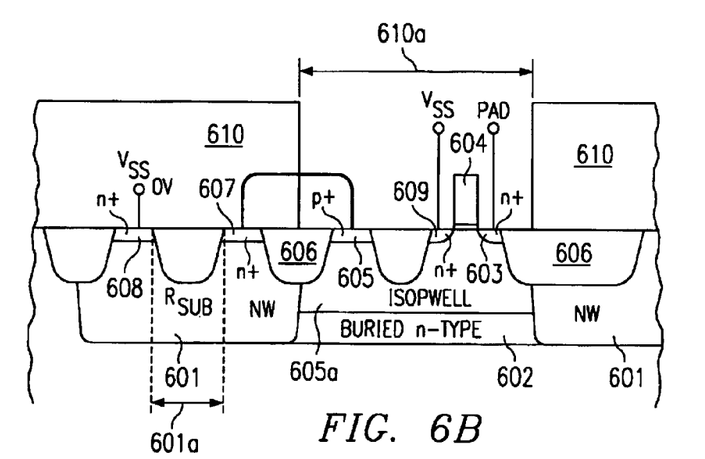

FIGS. 5A and 6A are schematic top views, and FIGS. 5B and 6B, respectively, are simplified cross sections of two examples of these embodiments. FIG. 5B is taken along cut line A–A' in FIG. 5A, and FIG. 6B is taken along cut line B–B' in FIG. 6A.

The embodiment of FIGS. 5A and 5B illustrates the example of a shallow isolated p-well. The same number has been given to the same respective identity in FIGS. 5A and 5B. 501 is the n-well and 502 the counterdoped part of the n-well (buried n-layer) having higher resistivity. 503 is the n+ drain of the MOS transistor, connected to the pad. 504 is the (conductive poly-silicon of the) gate. 505 is the p+ contact to the p-type isolated p-well 505a. In the example of FIGS. 5A and 5B, this isolated p-well is shallow and thus confined by the trench isolation 506. Contact 505 is connected to the n+ source 507 of the transistor, which also serves as one contact to the discreet n-well 501. The other contact to the discreet n-well is 508, which is connected to Vss/ground potential. The length 501a between contacts 507 and 508 serves as the pre-determined substrate resistance Rsub.

The embodiment of FIGS. 6A and 6B illustrates the example of a deep isolated p-well. The same number has been given to the same respective identity in FIG. 6A and 6B. 601 is the n-well and 602 the counterdoped part of the n-well (buried n-layer) having higher resistivity. 603 is the n+ drain of the MOS transistor, connected to the pad. 604 is the (conductive poly-silicon of the) gate. 605 is the p+ contact to the p-type isolated p-well 605a. In the example of FIGS. 6A and 6B, this isolated p-well is deep, this means deeper than the trench isolation 606. Contact 605 is connected to the n+ contact 607 of the one contact to the discreet n-well 501. The other contact to the discreet n-well is 608, which is connected to Vss/ground potential. The length 601a between contacts 607 and 608 serves as the pre-determined substrate resistance Rsub. The source 609 of the MOS transistor is also connected to Vss/ground potential.

Superimposed on the features of the finished device, FIG. 6B shows the photomask 610 and the position of its window 610a from a previous process step in order to emphasize a cost saving feature of the manufacturing process used for the device. Photomask 610 is employed for the ion implant steps creating the isolated p-well and the high-voltage drain extension and the Vt adjust (n-type), discussed in more detail in FIG. 11B.

Figure 7:
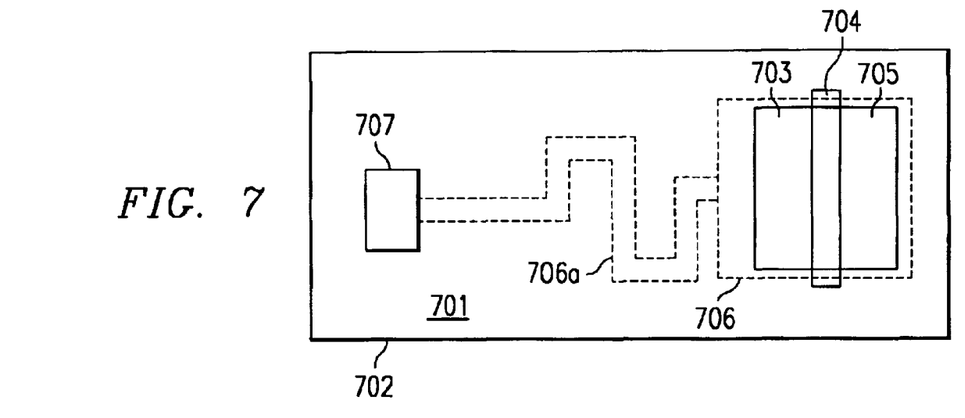
FIG. 7 is a schematic top view of a transistor layout to achieve a large substrate resistance for ESC protection.

A modification of the device structures in FIGS. 5A and 6A is schematically shown in FIG. 7. The modification illustrated how a pre-determined value for the resistance Rsub can be achieved by a meandering design of the isolated p-well. The n-well 701 is bordered by the trench isolation 702. Embedded in the n-well is the MOS transistor with n+ source 703, gate 704, and n+ drain 705. The photomask 706 for the drain extension ion implant step is designed in a meandering layout 706a, resulting in a meandering configuration of the isolated p-well. The meandering layout results in a pre-determined high value for Rsub. The p+ contact of the p-well is 707.

FIGS. 8 to 13 describe important steps of the manufacturing process flow of the embodiments, specifically of the embodiment illustrated in FIG. 3A.

Figure 8:
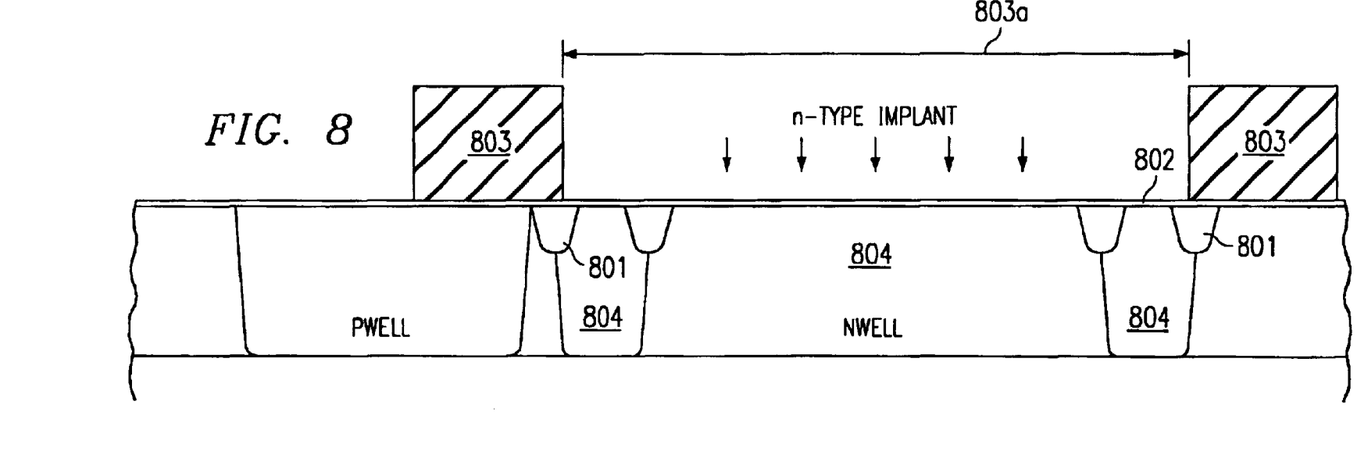
Figure 9:
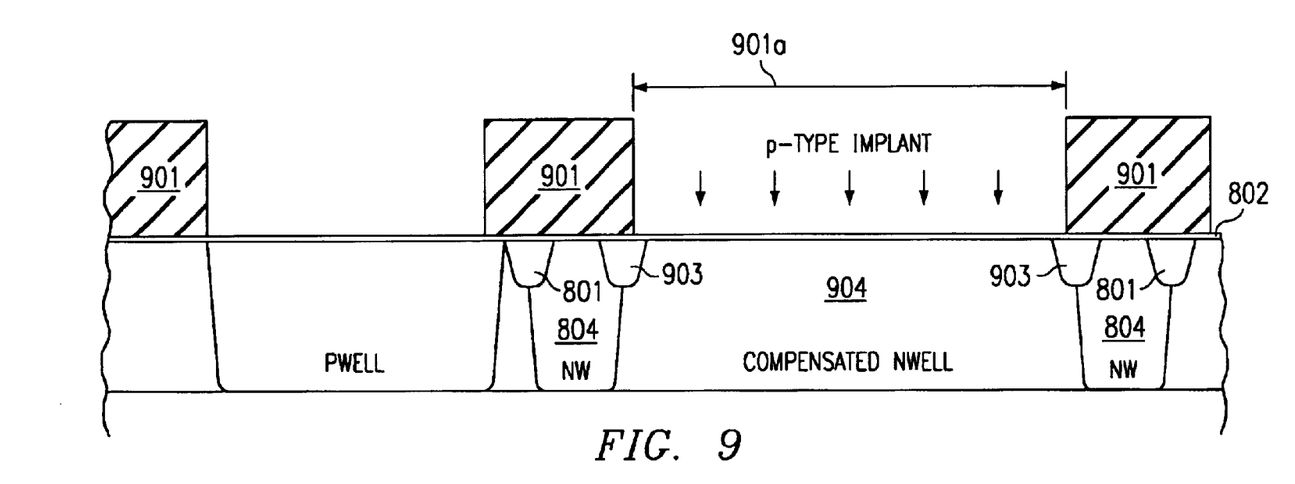
Figure 10:
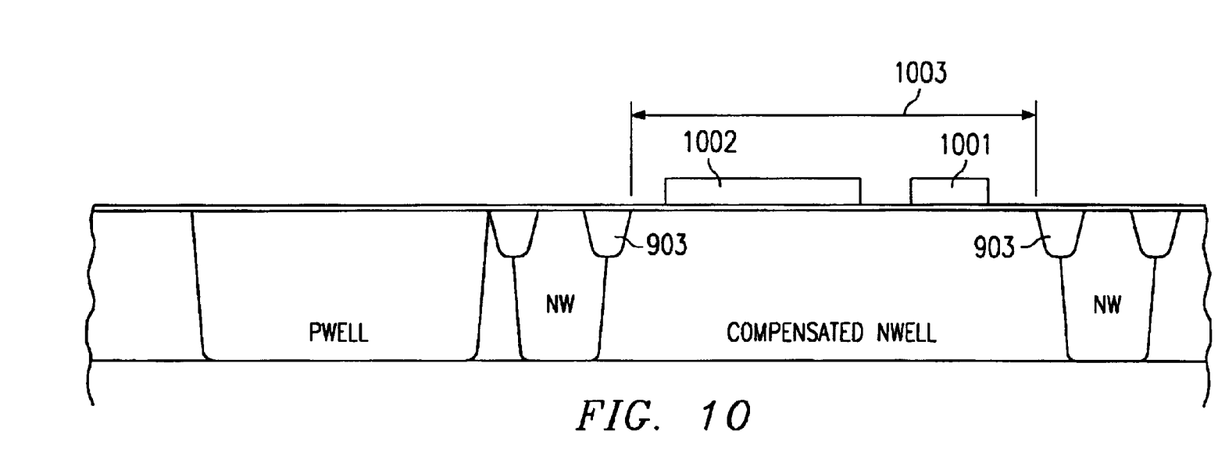
Figure 11A:
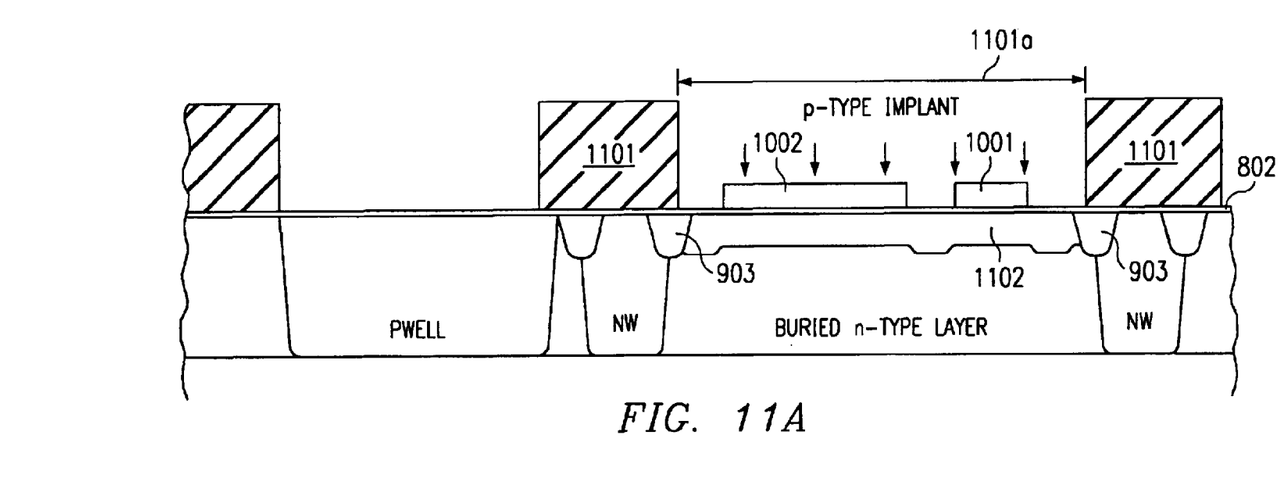
FIGS. 11A and 11B illustrate the multiple use of a photomask window in the transistor process flow, emphasizing the low cost aspect of the present invention.

FIG. 8: Depositing, between the isolation trenches 801 at the surface 802 of a semiconductor chip, a first photoresist layer 803 over chip surface 802 and opening a window 803a in this first layer between the isolation regions in the surface;

implanting, at high energy and high dose, ions of a first conductivity type into surface 802 through window 803a, creating a first well 804 of a first conductivity type. In the example of FIG. 8, the first conductivity type is n-type; n-type dopants may be selected from a group consisting of arsenic, phosphorus, antimony, and bismuth The energy of the ions is preferably suitable to create the first well at a depth between 900 and 1100 nm;

removing the first photoresist layer 803;

FIG. 9: Depositing a second photoresist layer 901 over the chip surface 802 and opening a window 901a in the second layer 901 between second isolation regions 903 in the surface 802, the second isolation regions 903 nested within the first isolation regions 801;

implanting, at high energy and low dose, ions of the opposite conductivity type into surface 802 through window 901a, creating, by partial doping compensation, a region 904 of lower doping concentration of the first conductivity type embedded in first well 804, resulting in a regional resistivity higher than the resistivity of the first well 804. In the example of FIG. 9, the opposite conductivity type is p-type; p-type dopants may be selected from a group consisting of boron, aluminum, gallium, indium, and lithium. The energy of the ions is preferably suitable to create the partially compensated region at a depth between 900 and 1100 nm;

removing the second photoresist layer 901;

FIG. 10: Forming the gate structures 1001 for an MOS transistor and 1002 for a dummy gate positioned in the surface space 1003 between second isolation regions 903;

FIG. 11A: Depositing a third photoresist layer 1101 over the chip surface and opening a window 1101a in the third layer 1101 between second isolation regions 903 in the surface 802;

implanting, at medium energy and medium dose, ions of the opposite conductivity type into the surface 802 through the window 1101a and through gate structures 1001 and 1002, creating a second well 1102 of opposite conductivity type close to and substantially parallel to the surface 802. The medium energy ions have an energy suitable for creating the second-well junction at a depth between 200 and 400 nm; they preferably have a peak concentration from about 5·10E17 to 5·10E20 cm−3.

Figure 11B:
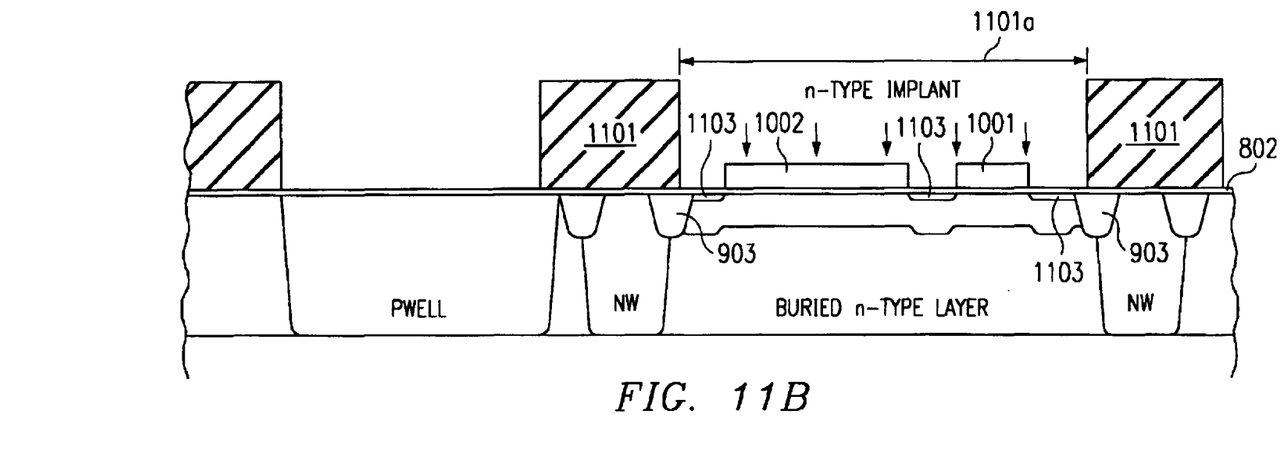
Figure 12:
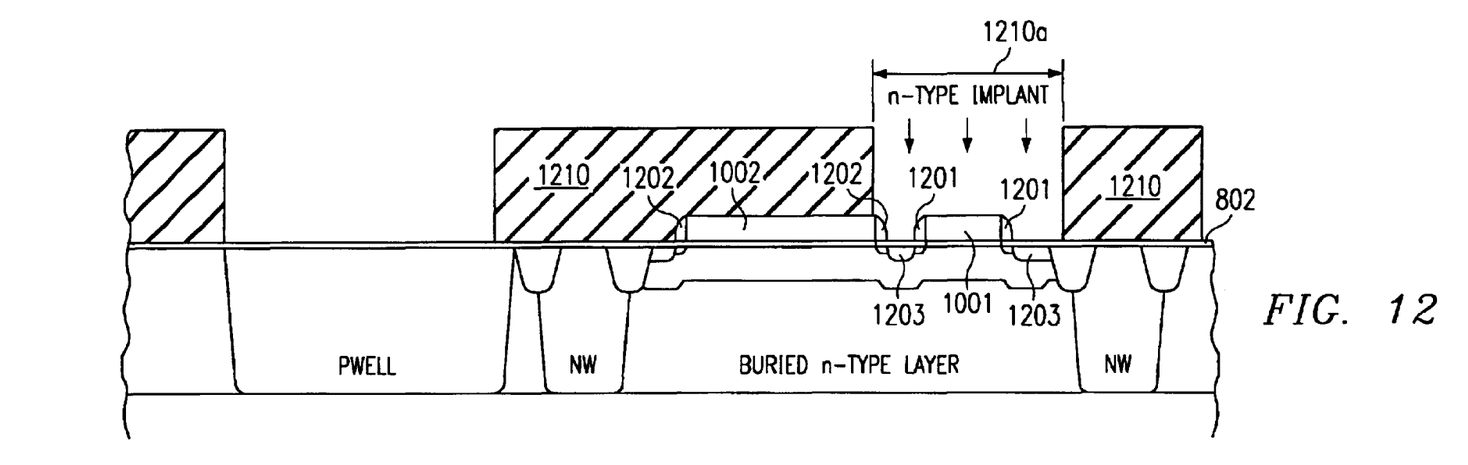
Figure 13:
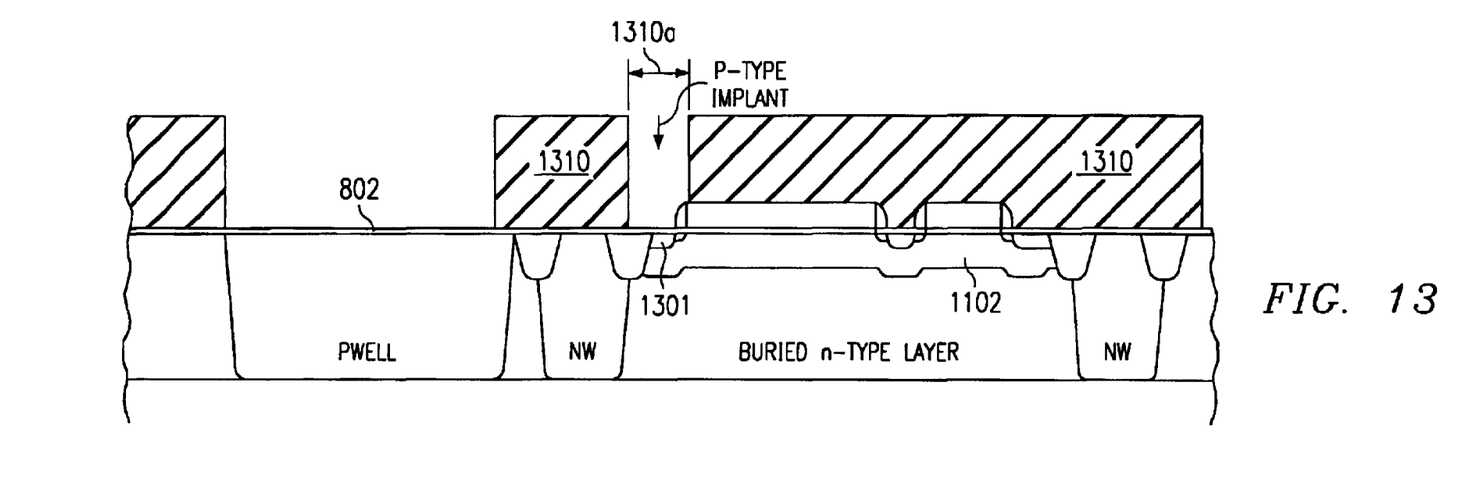

FIG. 11B: Implanting, at low energy and high dose, ions of the first conductivity type into the surface 802 through the window 1101a, creating the drain extension regions 1103 of the MOS transistor;

implanting, at low energy and low dose, ions of the opposite conductivity type into the surface 802 through the window 1101a and through gate structures 1001 and 1002, adjusting the gate voltage Vt of the MOS transistor (not shown in FIG. 11B);

removing the third photoresist layer 1101;

FIG. 12: Forming insulating sidewalls 1201 on the gate 1001, and sidewalls 1202 on the dummy gate 1002;

implanting ions of the first conductivity type into the surface 802 through the window 1210a of fourth photoresist layer 1210, forming deep source and drain regions 1203 of the MOS transistor; and FIG. 13: Implanting ions of the opposite conductivity type into the surface 802 through the window 1310a of fifth photoresist layer 1310, forming the contact region 1301 of the second well 1102 (p-type deep source/drain implant in the example of FIG. 13).

The process flow may be modified to include annealing steps at elevated temperature after the high energy and/or the medium energy implant steps.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the semiconductor chip may be made from a material selected from a group consisting of silicon, silicon germanium, gallium arsenide, or any other semiconductor material used in integrated circuit fabrication.

As another example, the step of implanting ions of the opposite conductivity type at medium energy and medium dose is replaced by the step of implanting ions of the opposite conductivity type at medium-to-high energy and medium dose. In this process, the ion energy is suitable to create the second well junction with the region of higher first-well resistivity at a depth between 600 and 800 nm (see FIG. 4A). The peak ion concentration is preferably from about 5·10E19 to 5·10E20 cm−3.

It is therefore intended that the appended claims encompass any such modifications or embodiments.

We claim:

1. A method for fabricating an integrated circuit located between isolation trenches at the surface of a semiconductor chip for, comprising the steps of:

depositing a first photoresist layer over a chip surface and opening a window in a first layer between first isolation regions in said surface;

implanting, at high energy and high dose, ions of a first conductivity type into said surface through said window, creating a first well of a first conductivity type;

removing said first photoresist layer;

depositing a second photoresist layer over said chip surface and opening a window in said second layer between second isolation regions in said surface, said second isolation regions nested within said first isolation regions;

implanting, at high energy and low dose, ions of the opposite conductivity type into said surface through said window, creating, by partial doping compensation, a region of lower doping concentration of the first conductivity type embedded in said first well, resulting in a regional resistivity higher than the resistivity of the first well;

removing said second photoresist layer;

forming gate structures for a MOS transistor positioned in the surface space between said second isolation regions;

depositing a third photoresist layer over said chip surface and opening a window in a third layer between said second isolation regions in said surface;

implanting, at medium energy and medium dose, ions of the opposite conductivity type into said surface through said window and through said gate structures, creating a second well of opposite conductivity type close to and substantially parallel to said surface;

implanting, at low energy and high dose, ions of the first conductivity type into said surface through said window, creating drain extension regions of said MOS transistor;

implanting, at low energy and low dose, ions of the opposite conductivity type into said surface through said window and through said gate structures, adjusting the gate voltage Vt of said MOS transistor;

removing said third photoresist layer;

forming insulating sidewalls on said gate, deep source and drain regions of said MOS transistor, and contact region of said second well, whereby said contact region is spaced from said MOS transistor by a predetermined distance.

2. The method according to claim 1 wherein said predetermined distance is selected to create a small voltage drop in I/O transistors for conditioning signals and power to a pad.

3. The method according to claim 1 wherein said predetermined distance is selected to create a large voltage drop in ESD circuits for protecting the active circuitry connected to a pad.

4. The method according to claim 1 further comprising the step of:

forming dummy gate structures concurrently with forming said MOS transistor gate structures;

thereby modulating the distribution of the subsequently implanted ions so that the junction between said second well and said region of higher first-well resistivity varies in distance to said surface in accordance with the configuration of said transistor gate and dummy gate structures.

5. The method according to claim 1, wherein said step of implanting ions of the opposite conductivity type at medium energy and medium dose is replaced by the step of implanting ions of the opposite conductivity type at medium-to-high energy and medium dose.

6. The method according to claim 5, after the step of forming the gate structures further comprising the step of:

forming an isolation region at said surface, extending between said MOS transistor source region and said second-well contact region;

thereby modulating the distribution of the subsequently implanted ions so that the junction between said second well and said region of higher first-well resistivity varies in distance to said surface in accordance with the configuration of said isolation region and said transistor gate structure.

7. The method according to claim 1 further comprising the step of annealing said high energy implant at elevated temperature.

8. The method according to claim 1 wherein said implanting of medium energy ions comprises ions having an energy suitable for creating the second-well junction at depth between 200 and 400 nm, and a peak concentration from about 5·10E17 to 5·10E20 cm−3.

9. The method according to claim 6 wherein said implanting of medium-to-high energy ions comprises ions having an energy suitable for creating the second-well junction at a depth between 600 and 800 nm, and a peak concentration from about 5·10E19 to 5·10E20 cm−3.

10. The method according to claim 1 wherein said implanting of high energy ions comprises ions having an energy suitable for creating the first well and the partially compensated region at a depth between 900 and 1100 nm.

* * * * *